(12) United States Patent
Pedoeem et al.

(10) Patent No.: US 7,443,685 B2
(45) Date of Patent: Oct. 28, 2008

(54) CONDUCTIVE HEAT TRANSFER FOR ELECTRICAL DEVICES FROM THE SOLDER SIDE AND COMPONENT SIDE OF A CIRCUIT CARD ASSEMBLY

(75) Inventors: Albert Pedoeem, West Orange, NJ (US); Lang Yuan, Pearl River, NY (US); Willie Braun, Franklin Lakes, NJ (US)

(73) Assignee: Fujitsu Limited, Kawasaki (JP)

( * ) Notice: Subject to any disclaimer, the term of this patent is extended or adjusted under 35 U.S.C. 154(b) by 281 days.

(21) Appl. No.: 11/048,901

(22) Filed: Feb. 3, 2005

(65) Prior Publication Data

US 2006/0171118 A1  Aug. 3, 2006

(51) Int. Cl.
*H05K 7/20* (2006.01)
*F28F 7/00* (2006.01)

(52) U.S. Cl. ............... 361/719; 165/80.2; 165/80.3; 165/185; 361/704; 361/708; 361/715; 361/690

(58) Field of Classification Search .............. 361/719
See application file for complete search history.

(56) References Cited

U.S. PATENT DOCUMENTS

| | | | |
|---|---|---|---|
| 5,608,610 A * | 3/1997 | Brzezinski | 361/704 |
| 5,708,566 A * | 1/1998 | Hunninghaus et al. | 361/704 |
| 5,923,084 A * | 7/1999 | Inoue et al. | 257/712 |
| 6,696,643 B2 * | 2/2004 | Takano | 174/520 |
| 6,700,195 B1 * | 3/2004 | Mandel | 257/718 |
| 6,816,377 B2 * | 11/2004 | Itabashi et al. | 361/704 |
| 6,821,816 B1 * | 11/2004 | Lawlyes | 438/108 |
| 7,023,699 B2 * | 4/2006 | Glovatsky et al. | 361/704 |
| 7,031,165 B2 * | 4/2006 | Itabashi et al. | 361/719 |
| 7,057,891 B2 * | 6/2006 | Ito et al. | 361/687 |
| 7,180,745 B2 * | 2/2007 | Mandel et al. | 361/719 |

\* cited by examiner

*Primary Examiner*—Gregory D Thompson
(74) *Attorney, Agent, or Firm*—Hanify & King, PC

(57) ABSTRACT

An apparatus for conductive heat transfer for electrical devices from the solder side of a circuit card assembly can significantly reduce the component temperature, thereby maintaining the electrical device below its thermal limit. The apparatus comprises a thermally conductive member mountable on an opposite face of a circuit board from a face of the circuit board on which an electrical component is mounted, the thermally conductive member operable to conduct heat generated by the electrical component away from the electrical component.

7 Claims, 3 Drawing Sheets

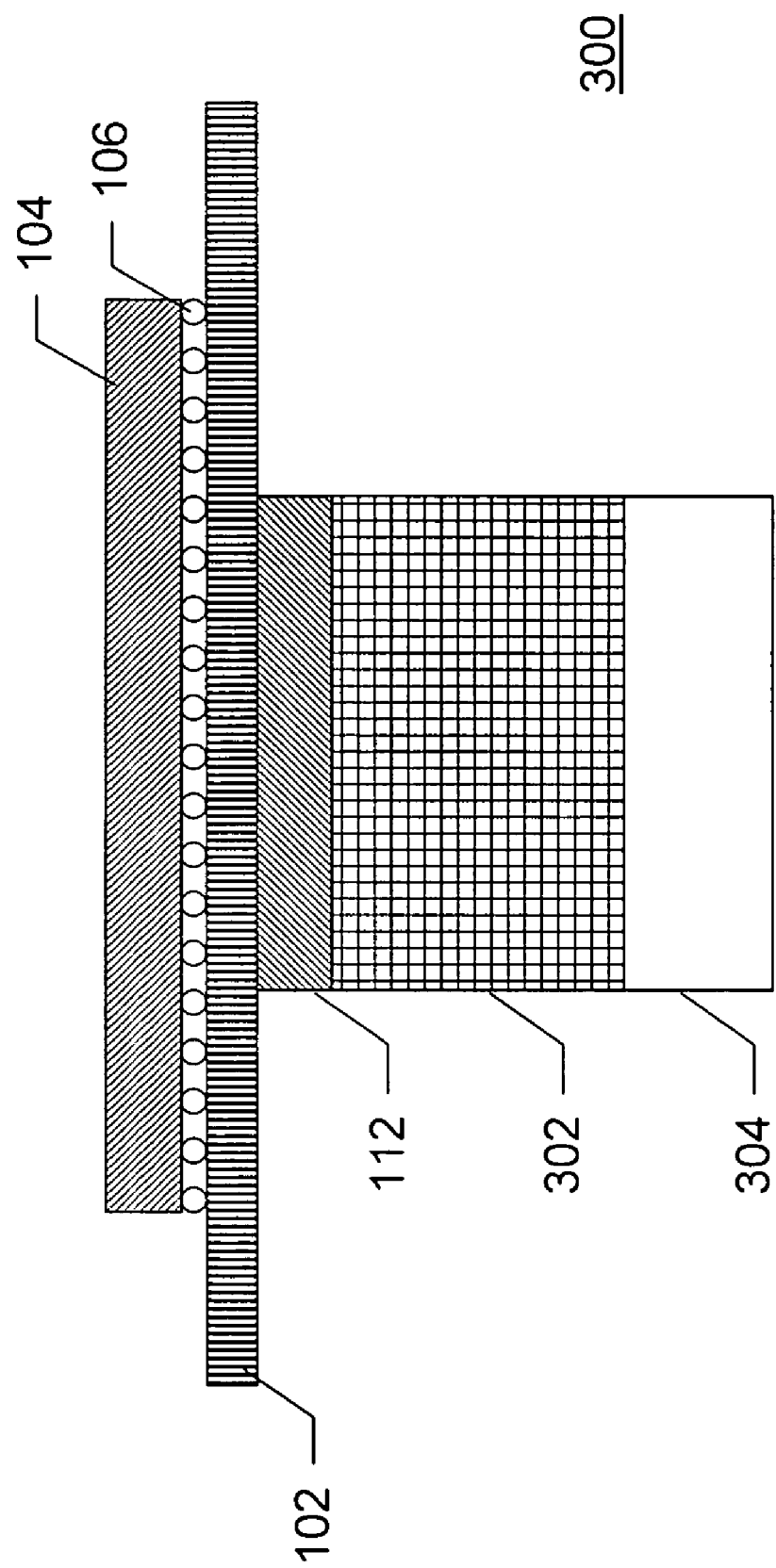

CONDUCTIVE HEAT TRANSFER FOR ELECTRICAL DEVICES FROM THE SOLDER SIDE AND COMPONENT SIDE OF A CIRCUIT CARD ASSEMBLY

BACKGROUND OF THE INVENTION

1. Field of the Invention

The present invention relates to an apparatus for conductive heat transfer for electrical devices from the solder side of a circuit card assembly.

2. Description of the Related Art

The trend in electrical components has been towards faster and more integrated components in smaller enclosures. As more, higher speed, circuitry is included in electrical components, the components tend to use more power and, therefore, dissipate more heat. The amount of heat generated by the electrical components within a small enclosure can cause the components to exceed their temperature rating, especially when relying on convection and radiation heat transfer to dissipate the heat Heatsinks and other traditional electrical component cooling devices are mounted to the top of a component. They can improve the component's convection and radiation heat transfer. However, they do not obtain the cooling effect that a good conductive path would provide. Another approach to increase the thermal capacity of a small enclosure is to incorporate a fan. A fan can improve the convective cooling but it also adds cost and decreases the reliability and service life of the system since fans have a low operating life.

A need arises for a way to provide an improved conductive heat path for an electrical device that can significantly reduce the component temperature, thereby maintaining the electrical device below its thermal limit.

SUMMARY OF THE INVENTION

This invention presents a novel way to provide a conductive heat path for an electrical device, such as a ball grid array package, from the solder side of the printed circuit board to the enclosure. This approach can significantly reduce the component temperature, thereby maintaining the electrical device below its thermal limit.

This invention employs the backside (or opposite face from that on which the electrical component is mounted) of the printed circuit board to remove heat from an electrical component. Technology today dictates that electrical components are capable of higher power dissipations. Typically, these high power components are a ball grid array package. Since the package has many solder balls and the printed circuit board (PCB) below it has a large percentage of copper coverage, the circuit board becomes a good conductive heat path. The backside of the PCB is available for heat removal.

This invention mounts a compliant thermal interface material on the backside of the PCB directly on the opposite side of a high heat dissipating electrical device. The compliant material can be placed directly over small surface mount capacitors and resistors. An optional aluminum block is adhered to the top of the thermal interface material. The opposite face of the optional aluminum block mates to the enclosure. To insure there is no air at the interface between the optional aluminum block and the enclosure, a thermal phase change material, or other thermally conductive interface material, is applied.

In one embodiment of the present invention, an apparatus comprises a thermally conductive member mountable on an opposite face of a circuit board from a face of the circuit board on which an electrical component is mounted, the thermally conductive member operable to conduct heat generated by the electrical component away from the electrical component.

In one aspect of the present invention, the thermally conductive member comprises a compliant thermal interface material in contact with the circuit board. The thermally conductive member comprises a thermally conductive block in contact with the compliant thermal interface material. The thermally conductive member comprises a thermally conductive phase change material in contact with the thermally conductive block.

In one aspect of the present invention, the thermally conductive member comprises a heatsink in contact with the compliant thermal interface material. The apparatus further comprises a fan mounted on the heatsink.

In one aspect of the present invention, the thermally conductive member is further operable to conduct heat to an enclosure enclosing the circuit board. The thermally conductive member comprises a compliant thermal interface material in contact with the circuit board. The compliant thermal interface material is operable to contact the enclosure. The thermally conductive member comprises a thermally conductive block in contact with the compliant thermal interface material. The thermally conductive member comprises a thermally conductive phase change material in contact with the thermally conductive block. The thermally conductive phase change material is operable to contact the enclosure.

BRIEF DESCRIPTION OF THE DRAWINGS

FIG. 3 is an exemplary diagram of a heat dissipating arrangement, according to the present invention.

DETAILED DESCRIPTION OF THE PREFERRED EMBODIMENTS

The present invention employs the backside of the printed circuit board to remove heat from an electrical component. Technology today dictates that electrical components are capable of higher power dissipations. Typically, these high power components are a ball grid array package. Since the package has many solder balls and the printed circuit board (PCB) below it has a large percentage of copper coverage, the circuit board becomes a good conductive heat path. The backside of the PCB is available for heat removal.

This invention mounts a compliant thermal interface material on the backside of the PCB directly below a high heat dissipating electrical device. The compliant material can be placed directly over small surface mount capacitors and resistors. An optional aluminum block is adhered to the top of the thermal interface material. The opposite face of the optional aluminum block mates to the enclosure. To insure there is no air at the interface between the optional aluminum block and the enclosure, a thermal phase change material is applied. See separate attachment depicting the invention.

Figure 1:
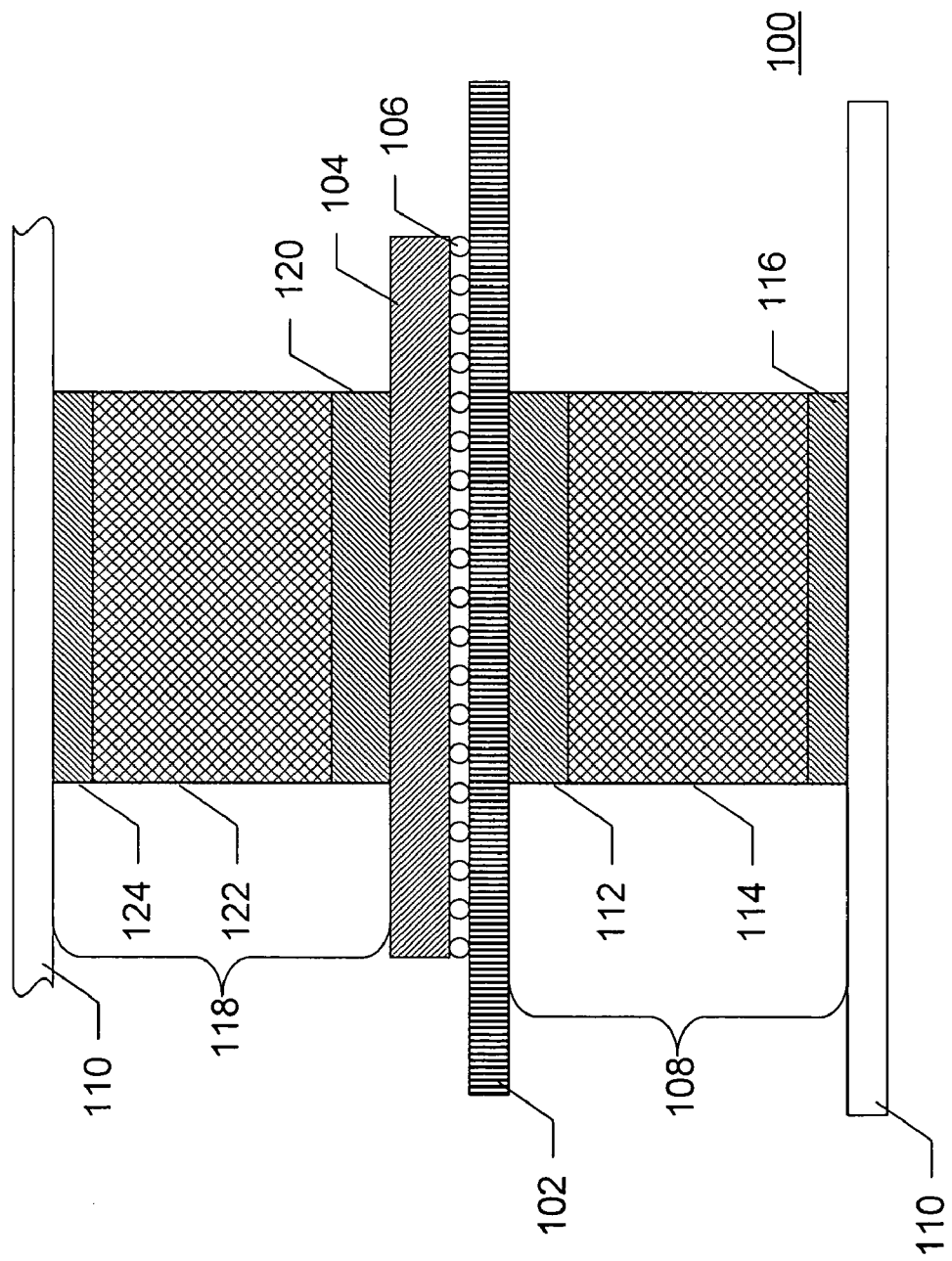
FIG. 1 is an exemplary diagram of a heat dissipating arrangement, according to the present invention.

An example of a heat dissipating arrangement 100, according to the present invention, is shown in FIG. 1. As shown in FIG. 1, a printed circuit board (PCB) 102 has mounted on it an electrical component 104. In this example, electrical component 104 is packaged in a ball grid array (BGA) package and connected to PCB 102 by a plurality of metallic balls 106. A ball grid array is a type of surface-mount packaging used for integrated circuits. In a BGA, the pins are replaced by balls of solder stuck to the bottom of the package. The device is placed on a PCB that carries copper pads in a pattern that matches the solder balls. The assembly is then heated, either in a reflow oven or by an infrared heater, causing the solder balls to melt. Surface tension causes the molten solder to hold the package in alignment with the circuit board, at the correct separation distance, while the solder cools and solidifies. A further advantage of BGA packages over leaded packages is the lower thermal resistance between the package and the PCB. This allows heat generated by the integrated circuit inside the package to flow more easily to the PCB. The present invention is also applicable to other types of packages with significant heat flow through the bottom of the package, such as quad flat packs, etc.

The present invention utilizes the PCB under a BGA package to transfer heat from the PCB to the enclosure for dissipation. Heat conducting assembly 108 conducts heat generated by electrical component 104 from the backside of PCB 102 in the area underneath component 104 to the enclosure 110 in which PCB 102 is housed. In the embodiment shown in FIG. 1, heat conducting assembly 108 includes a compliant thermal interface material 112 in contact with the backside of PCB 102 in the area underneath component 104. The compliance of the material allows it to be placed directly over any small surface mount capacitors and resistors that may be present on this area of PCB 102. An optional thermally conductive block 114 is adhered to the opposite side of thermal interface material 112. Block 114 may be any thermally conductive material. In a preferred embodiment, block 114 is an aluminum block. The opposite face of the optional aluminum block 114 mates to the enclosure 110. To ensure that there is no air gap at the interface between the optional aluminum block 114 and the enclosure 110, a thermally conductive thermal phase change material 116 is applied between block 114 and enclosure 110.

The arrangement shown in FIG. 1 is merely an example. The present invention contemplates any arrangement by which heat may be conducted from the backside of PCB 102 to enclosure 110. For example, if the gap between PCB 102 and enclosure 110 is sufficiently small, block 114 and phase change material 116 may be omitted and compliant thermal material 112 may directly contact enclosure 110. Alternatively, block 114 may be omitted and only compliant thermal material 112 or thermal phase change material 116 may be used.

Assembly 108 may be used alone, or it may be used in conjunction with thermal apparatus mounted on electrical component 104. An example of this is shown in FIG. 1. In FIG. 1, a heat conducting assembly 118, which is similar to heat conducting assembly 108, is mounted on electrical component 104 and conducts heat from the package of component 104 to the enclosure 110. In this example, assembly 118 includes compliant thermal material 120, thermally conductive block 122, and thermal phase change material 124. Other arrangements of assembly 118 may be used, similar to those that may be used for assembly 108.

Figure 2:
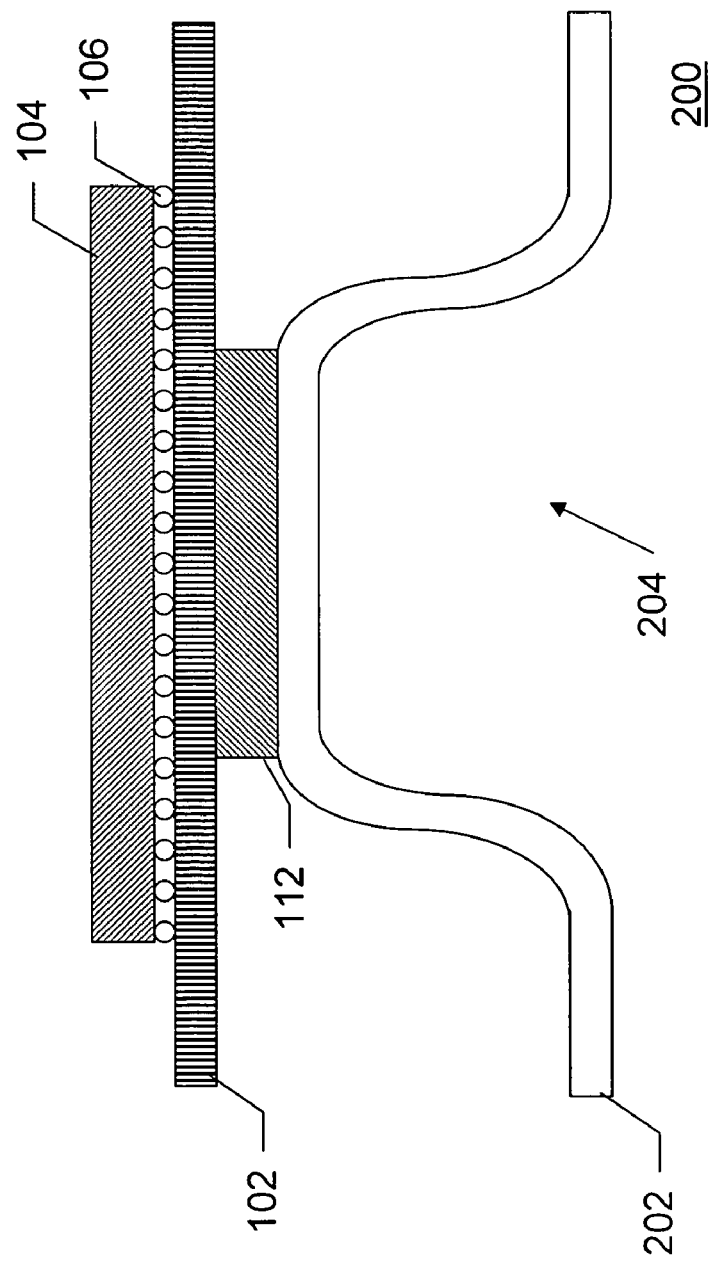
FIG. 2 is an exemplary diagram of a heat dissipating arrangement, according to the present invention.

Another example of a heat dissipating arrangement 200, according to the present invention, is shown in FIG. 2. In the example shown in FIG. 2, PCB 102 has mounted on it an electrical component 104. In this example, electrical component 104 is packaged in a ball grid array (BGA) package and connected to PCB 102 by a plurality of metallic balls 106. Compliant thermal interface material 112 directly contacts enclosure 202, which has been formed with a "bump" 204, which closes the gap between enclosure 202 and the backside of PCB 102 to a sufficiently small distance that compliant thermal material 112 may be used to directly contact both PCB 102 and enclosure 202.

Another example of a heat dissipating arrangement 300, according to the present invention, is shown in FIG. 3. In the example shown in FIG. 3, PCB 102 has mounted on it an electrical component 104. In this example, electrical component 104 is packaged in a ball grid array (BGA) package and connected to PCB 102 by a plurality of metallic balls 106. Compliant thermal material interface material 112 is in contact with the backside of PCB 102 in the area underneath component 104. A heatsink 302 is attached to compliant thermal material interface material 112. Heatsink 302 provides dissipation of heat generated by electrical component 104 within the enclosure (not shown), rather than conducting the heat to the enclosure itself. Optionally, a fan 304 may be mounted to heatsink 302, to increase airflow over the heatsink and increase the resulting heat dissipation, as is well-known.

Compliant thermal material 112 may be any current or future compliant thermal material that provides suitable thermal conductivity and physical compliance for the particular application under consideration. An example of a suitable material is the FUJIPOLY® SARCON® GR-b Series material available from Fujipoly America Corporation of Carteret, N.J. In particular, the 400 GR-b material was found to be suitable for conducting heat generated by an electrical component in a BGA package. Of course, other models of this material, as well as other similar materials from the same and from other manufacturers, may be used for similar and for other applications. Selection of a suitable material is dependent upon factors such as thermal conductivity and cost, and is well within the capabilities of one skilled in the art.

Thermally conductive block 114 (if used) may be any current or future thermally conductive material that provides suitable thermal conductivity for the particular application under consideration. An example of a suitable material is aluminum. Other materials, such as copper or silver, provide improved thermal conductivity, but at increased cost. Selection of a suitable material is dependent upon factors such as thermal conductivity and cost, and is well within the capabilities of one skilled in the art.

Thermal phase change material 116 may be any current or future thermal phase change material 116 that provides suitable thermal conductivity and gap-filling capability for the particular application under consideration. An example of a suitable material is the THERMAFLOW® Phase-Change material available from CHOMERICS® division of PARKER-HANNIFIN® of Woburn, Mass. In particular, the material was found to be suitable for conducting heat generated by an electrical component in a BGA package. Of course, other models of this material, as well as other similar materials from the same and from other manufacturers, may be used for similar and for other applications. Selection of a suitable material is dependent upon factors such as thermal conductivity and cost, and is well within the capabilities of one skilled in the art.

Although specific embodiments of the present invention have been described, it will be understood by those of skill in the art that there are other embodiments that are equivalent to the described embodiments. Accordingly, it is to be understood that the invention is not to be limited by the specific illustrated embodiments, but only by the scope of the appended claims.

What is claimed is:

1. An apparatus comprising:
a first thermally conductive member comprising a silicone rubber member mounted on an opposite face of a circuit board from a face of the circuit board on which an electrical component is mounted, the electrical component comprising an electrical device encapsulated in a ball grid array package, the contacts of the ball grid array package soldered to the face of the circuit board on which the electrical component is mounted, the first thermally conductive member operable to conduct heat generated by the electrical component through the contacts of the ball grid array package and the circuit board away from the electrical component, wherein the first thermally conductive member further comprises a thermally conductive block in contact with the silicone rubber member and a thermally conductive phase change material in contact with the thermally conductive block and with an enclosure enclosing the circuit board.

2. The apparatus of claim 1, further comprising:
a second thermally conductive member mountable on the electrical component, the second thermally conductive member operable to conduct heat generated by the electrical component away from the electrical component.

3. The apparatus of claim 2, wherein the second thermally conductive member comprises a compliant thermal interface material in contact with the electrical component.

4. The apparatus of claim 3, wherein the second thermally conductive member comprises a thermally conductive block in contact with the compliant thermal interface material.

5. The apparatus of claim 4, wherein the second thermally conductive member comprises a thermally conductive phase change material in contact with the thermally conductive block.

6. The apparatus of claim 2, wherein the second thermally conductive member is further operable to conduct heat to the enclosure enclosing the circuit board on which the electrical component is mounted.

7. The apparatus of claim 6, wherein the second thermally conductive member comprises a compliant thermal interface material in contact with the electrical component.

* * * * *